(12) United States Patent
Happer et al.

(10) Patent No.: US 7,102,451 B2
(45) Date of Patent: Sep. 5, 2006

(54) METHOD AND SYSTEM FOR OPERATING AN ATOMIC CLOCK WITH ALTERNATING-POLARIZATION LIGHT

(75) Inventors: William Happer, Princeton, NJ (US); Yuan-Yu Jau, Princeton, NJ (US); Nicholas N. Kuzma, Princeton, NJ (US); Eli Miron, Omer (IL); Amber B. Post, Batesville, AZ (US); Michael V. Romalis, Princeton, NJ (US)

(73) Assignee: Princeton University, Office of Technology, Licensing & Intellectual Property, Princeton, NJ (US)

( * ) Notice: Subject to any disclaimer, the term of this patent is extended or adjusted under 35 U.S.C. 154(b) by 42 days.

(21) Appl. No.: 11/052,261

(22) Filed: Feb. 7, 2005

(65) Prior Publication Data
US 2005/0212607 A1   Sep. 29, 2005

Related U.S. Application Data

(60) Provisional application No. 60/545,359, filed on Feb. 18, 2004.

(51) Int. Cl.
H03B 17/00 (2006.01)
H01S 1/06 (2006.01)

(52) U.S. Cl. .................................................. 331/94.1
(58) Field of Classification Search .......... 331/3, 331/94.1
See application file for complete search history.

(56) References Cited

U.S. PATENT DOCUMENTS

2005/0212607 A1* 9/2005 Happer et al. ............. 331/94.1

OTHER PUBLICATIONS

W.E. Bell and A.L. Bloom, "Optically Driven Spin Precession", Phys. Rev. Lett.6(6):280-81.

W.E. Bell and A.L. Bloom, "Optical Detection of Magnetic Resonance in Alkali Metal Vapor", Phys. Rev. 107(6):1559-1556 (1957).

D.E. Nikonov et al., "Atomic Coherence Effects Within The Sodium D1 Manifold: II. Coherent Optical Pumping",Quantum Opt. 6: 245-60.

J. Vanier, et al., "Contrast and Linewidth of the Coherent Population Trapping Transmission Hyperfine Resonance Line in 87Rb: Effect of Optical Pumping", Phys. Rev. A67: (065801): 1-4 (2003).

* cited by examiner

*Primary Examiner*—David Mis
(74) *Attorney, Agent, or Firm*—Mathews, Shepherd, McKay & Bruneau, P.A.

(57) ABSTRACT

The present invention provides a method and apparatus for increasing the intensity of coherent population trapping (CPT) resonances, used in atomic clocks and magnetometers, by pumping the atoms with light of alternating polarization. Pumping with such light, characterized by a photon spin vector that alternates in direction at a hyperfine frequency of the atoms at the location of the atoms, is referred to as push-pull pumping. In one embodiment of the system of the present invention, alkali-metal vapor is pumped with alternating circular-polarization D1 laser light that is intensity modulated at appropriate resonance frequencies, thereby exciting CPT resonances, which can be observed as increase in the mean transmittance of the alkali-metal vapor. These resonances are substantially enhanced due to an optically-induced concentration of atoms in the resonant energy sublevels.

81 Claims, 9 Drawing Sheets

$^{87}$Rb energy levels and resonances (not to scale)
A. atomic energy levels
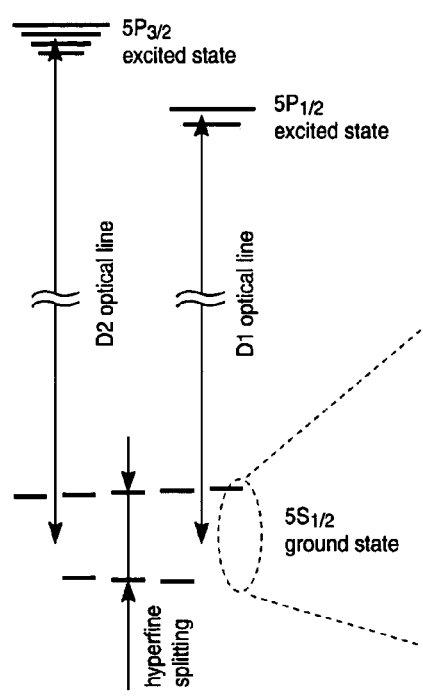
B. hyperfine structure of the ground state
(bars on the levels show spin-temperature population distribution due to optical pumping with circularly-polarized light)
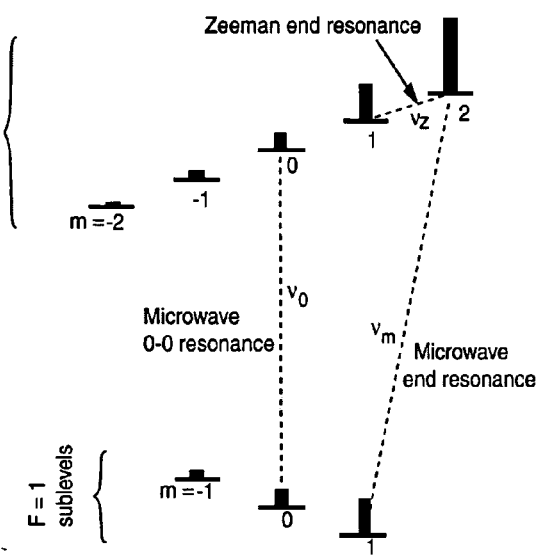
FIG. 1A
FIG. 1B

Light Modulation Pattern

On-Resonance Population of $^{87}$Rb Hyperfine Sublevels

Calculated CPT Signal

FIGS. 6A-C

Light Modulation Pattern

On-Resonance Population of $^{87}$Rb Hyperfine Sublevels

Calculated CPT Signal

FIGS. 7A-C

METHOD AND SYSTEM FOR OPERATING AN ATOMIC CLOCK WITH ALTERNATING-POLARIZATION LIGHT

CROSS REFERENCE TO RELATED APPLICATION

This application claims priority to U.S. Provisional Application No. 60/545,359, filed on Feb. 18, 2004, the disclosure of which is hereby incorporated by reference in its entirety.

STATEMENT OF GOVERNMENT FUNDED RESEARCH

This work was supported by the Air Force Office Scientific Research F49620-01-1-0297. Accordingly, the Government has certain rights in this invention.

BACKGROUND OF THE INVENTION

1. Field of the Invention

The present invention relates to the field of optically pumped atomic clocks or magnetometers, and more particularly to atomic clocks or magnetometers that operate by probing 0-0 coherent population trapping (CPT) resonances using light of alternating polarization referred to as push-pull pumping.

2. Description of the Related Art

Conventional, gas-cell atomic clocks utilize optically pumped alkali-metal vapors. Atomic clocks are utilized in various systems that require extremely accurate frequency measurements. For example, atomic clocks are used in GPS (global positioning system) satellites and other navigation and positioning systems, as well as in cellular phone systems, radio communications, scientific experiments and military applications. A design similar to that of an atomic clock is also utilized as a magnetometer, since some of the atomic resonances are highly sensitive to the magnetic field.

In one type of atomic clock, a cell containing an active medium, such as rubidium or cesium vapor, is irradiated with both optical and microwave power. The cell contains a few droplets of alkali metal and an inert buffer gas (such as $N_2$, any of the noble gases, or a mixture thereof) at a fraction of an atmosphere of pressure. Light from the optical source pumps the atoms of the alkali-metal vapor from a ground state to an optically excited state, from which the atoms fall back to the ground state, either by emission of fluorescent light or by quenching collisions with a buffer gas molecule such as $N_2$. The wavelength and polarization of the light are chosen to ensure that some ground state sublevels are selectively depopulated, and other sublevels are overpopulated compared to the normal, nearly uniform distribution of atoms between the sublevels. The resonant transitions (or resonances) between these sublevels can be probed by the microwaves. It is also possible to excite the same resonances by modulating the light at the Bohr frequency of the resonance (a method currently known as coherent population trapping, or CPT), as first pointed out by Bell and Bloom, W. E. Bell, and A. L. Bloom, Phys. Rev. Lett. 6, 280 (1961), hereby incorporated by reference into this application. The changes in the ground state of alkali-metal atoms, introduced by the resonance, lead to a change in the transparency of the vapor, so a different amount of light passes through the vapor to a photo detector that measures the transmission of the pumping beam, or to photo detectors that measure fluorescent light scattered out of the beam. When an applied magnetic field, produced by the microwaves, oscillates with a frequency equal to one of the Bohr frequencies of the atoms, the populations of the ground-state sublevels are perturbed and the transparency of the vapor changes. If excitation by the modulated light (CPT) is used instead of the microwaves, a coherent superposition state of the ground-state sublevels is generated when the light modulation frequency or one of its harmonics matches one of the Bohr frequencies of the atoms. The changes in the transparency of the vapor are used to lock a clock or a magnetometer to the Bohr frequencies of the alkali-metal atoms.

The Bohr frequencies of a gas-cell atomic clock are the frequencies v with which the electron spin S and the nuclear spin I of an alkali-metal atom precess about each other and about an external magnetic field. For the ground state, the precession is caused by magnetic interactions. Approximate clock frequencies are $v=6.835$ GHz for $^{87}$Rb and $v=9.193$ GHz for $^{133}$Cs. Conventionally, clocks have used the "0-0" resonance which is the transition between an upper energy level with azimuthal quantum number m=0 and total angular momentum quantum number $F=I+\frac{1}{2}$, and a lower energy level, also with azimuthal quantum number m=0 but with total angular momentum quantum number $F=I-\frac{1}{2}$.

Conventionally, to excite CPT resonances, frequency-modulated (FM) or phase-modulated (PM) optical-pumping light with wavelengths close to the D1 or D2 resonance lines of the atom (shown in FIG. 1A) are used. The light is modulated at a microwave frequency v close to one half of the 0-0 resonance frequency $v_0$, shown in FIG. 1B. The modulation amplitude and the carrier frequencies are chosen to optimize the sideband spectrum for CPT signals. The time-averaged transparency of the vapor increases when $v=v_0/2$. The full width at half maximum of this CPT resonance can be less than 1 kHz. The amplitude of the 0-0 CPT resonance is not very large, often amounting to an increase in the time-averaged transmission by less than 1%. The frequency $v_0$ of the 0-0 resonance has a very weak, quadratic dependence on the magnetic field, so some control of the magnetic field is needed to stabilize the clock.

In FIG. 1A, the atomic energy levels and the optical transitions are shown for an optically pumped atomic clock. The ground state of an alkali-metal atom, illustrated with $^{87}$Rb, is split into hyperfine sublevels by the Fermi contact interaction between the electronic spin, with quantum number S=1/2, and the nuclear spin, with quantum number I=3/2. An expanded diagram of the ground-state sublevels of $^{87}$Rb is shown in FIG. 1B. The hyperfine splitting separates the energies of sublevels with the total angular momentum quantum number F=I+S=2 from those with F=I−S=1. The energies of sublevels with the same F but different azimuthal quantum numbers m are shifted relative to each other by the magnetic field. Pumping alkali-metal atoms with D1 resonance light of fixed circular polarization drives the ground-state population distribution toward the end states of maximum or minimum m, depending on the sense (right or left) of circular polarization of the light. For high-density vapor, where spin-exchange collisions are the dominant spin-relaxation mechanism, or at high buffer-gas pressures, a spin-temperature population distribution similar to the one illustrated by the vertical bars in FIG. 1B is produced. For lower buffer-gas pressures and slower spin-exchange rates, the distributions are qualitatively similar, but differ in detail. The build up of the population in the end states results in very large microwave and Zeeman end resonance signals at frequencies $v_m$ and $v_z$, as illustrated in FIG. 1B. However, the 0-0 resonance signal at $v_0$ is very small, since the build up of population in the end state leaves few atoms in the initial and final states of the 0-0 resonance.

It has been found that the 0-0 resonance excited and probed by frequency-modulated light becomes too small for practical use at buffer-gas pressures exceeding a few hundred torr as described in D. E. Nikonov et al., Quantum Opt. 6, 245 (1994). Broadening of the optical absorption lines degrades the CPT signals generated with frequency modulated light in much the same way, and for analogous reasons, as decreasing the Qs (quality factors) of the two tuned circuits degrades the performance of phase-shift discriminators of FM radio or television receivers. The population concentration in the end state and the suppression of the 0-0 resonance also occurs when the pumping is done with unmodulated light of fixed circular polarization, and it is independent of whether the resonances are excited by microwaves, or with the circularly polarized light that is frequency-modulated at $v_0/2$, half the 0-0 frequency.

Conventional CPT atomic clock systems have used modulated light of fixed polarization. It has been found that less degradation of the 0-0 CPT resonances with increasing buffer gas pressure occurs if light of fixed circular polarization is intensity-modulated at the frequency $v_0$ instead of being frequency-modulated at $v_0/2$.

Modeling calculations of population distributions and CPT resonances produced by intensity-modulated, right-circularly-polarized (RCP) light are shown in FIGS. 2A–C for $^{87}$Rb. The intensity-modulation pattern of RCP D1 pumping light is shown in FIG. 2A. The atomic population distribution among the ground-state sublevels is shown in FIG. 2B. The circularly polarized light pumps the atoms toward the end state of maximum azimuthal spin quantum number m, and away from the m=0 states participating in the resonance. FIG. 2C shows the calculated CPT resonance in the time-averaged absorption cross-section $\bar{\sigma}$ of the atoms, normalized to the cross section $\sigma_0$ for unpolarized atoms. The detuning $\omega - \omega_0$ of the modulation frequency $\omega$ from the resonance frequency, $\omega_0 = 2\pi v_0$, is normalized to the S-damping rate $\Gamma_{sd}$. Buffer gas pressures are assumed which are high enough to seriously degrade the FM or PM CPT. It is shown that the CPT resonance with intensity modulated light is barely visible, as a small decrease in the time-averaged cross section $\bar{\sigma}$, which is plotted in units of the absorption cross section $\sigma_0$ of completely unpolarized atoms. For the modeling calculations of FIGS. 2A–C, a mean optical pumping rate $\Gamma_{op}$ was used which was three times the S-damping rate $\Gamma_{sd}$ of spins in the gas, i.e. $\Gamma_{op} = 3 \Gamma_{sd}$. It was assumed that a small additional spin loss occurs at a rate $\Gamma = 0.01 \Gamma_{sd}$ due to diffusion of alkali-metal atoms to the walls. The instantaneous pumping rate of the RCP light was assumed to have the time dependence $R = \Gamma^{op} (2^P p!)^2 [2(2p)!]^{-1} \cos^{2p} \pi v_0 t$ with p=2. Any intensity modulation format with a similar time dependence gives comparable results.

The CPT signal with pulsed light of fixed circular-polarization at very high buffer-gas pressure has about the same amplitude as the CPT signal at low pressures with frequency-modulated light. In both cases, the small signal amplitude is due to the accumulation of most of the atoms in the end state, as shown in FIG. 2B. The suppression of the 0-0 CPT signal due to optical pumping has been discussed in J. Vanier, M. W. Levine, D. Janssen, and M. Delaney, Phys. Rev. A 67, 065801 (2003).

It is desirable to provide a method and system to increase the intensity of 0-0 coherent popularity trapping (CPT) resonances in alkaline-metal vapors.

SUMMARY OF THE INVENTION

The present invention provides a method and apparatus for increasing the intensity of the 0-0 coherent population trapping (CPT) resonance by pumping with D1 light characterized by photon spin that alternates, or has a component alternating, at a hyperfine resonance frequency between pointing along and pointing against the direction of the externally applied magnetic filed at the location of the atoms. This method will be referred to as push-pull pumping. One example involves pumping with D1 light that alternates between the states of right circular polarization (RCP) and left circular polarization (LCP) or, more generally, between the states of right elliptical polarization (REP) and left elliptical polarization (LEP), at the 0-0 hyperfine resonance frequency. Another example involves pumping with the light generated by combining two or more beams of fixed, mutually perpendicular linear polarizations, wherein optical frequencies of the beams differ from each other by a hyperfine frequency of the atoms. In yet another example, the light of alternating polarization is generated by two counter-propagating beams of fixed circular polarization. Both beams are amplitude- or frequency-modulated at a hyperfine frequency of the atoms in such a way that the local photon-spin vector produced by the two beams at the location of the atoms alternates its direction at a hyperfine frequency of the atoms. In one embodiment of the system of the present invention, alkali metal vapor is pumped with intensity-modulated (at appropriate resonance frequencies) D1 laser light of alternating circular polarization, thereby providing coherent population trapping (CPT) resonances, that can be observed as an increase in the mean transmittance of the alkali-metal vapor. Alternatively, the pumping light of alternating polarization can be generated by interspersed beams of RCP light and LCP light such that the intensity-modulated LCP light is shifted (or delayed) with respect to the RCP light by half a modulation period $T = 1/(2v_0)$.

The invention will be more fully described by reference to the following drawings.

BRIEF DESCRIPTION OF THE DRAWINGS

FIG. 1A is a schematic diagram of the ground state and the first two optically excited states of an alkali-metal atom such as $^{87}$Rb.

FIG. 1B is a schematic diagram of the ground-state sublevels and of sublevel populations produced by optical pumping with modulated light of fixed circular polarization.

DETAILED DESCRIPTION

Figure 2A:
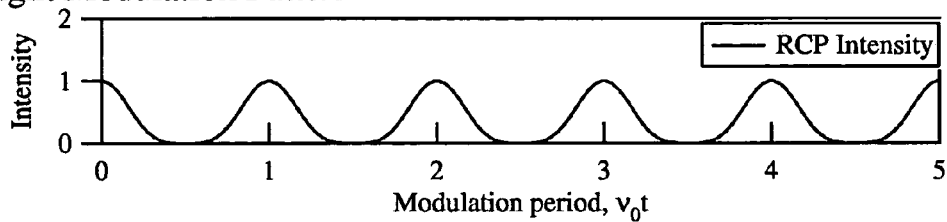
FIG. 2A is a schematic diagram of a light-modulation pattern of right circularly polarized (RCP) D1 pumping light.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
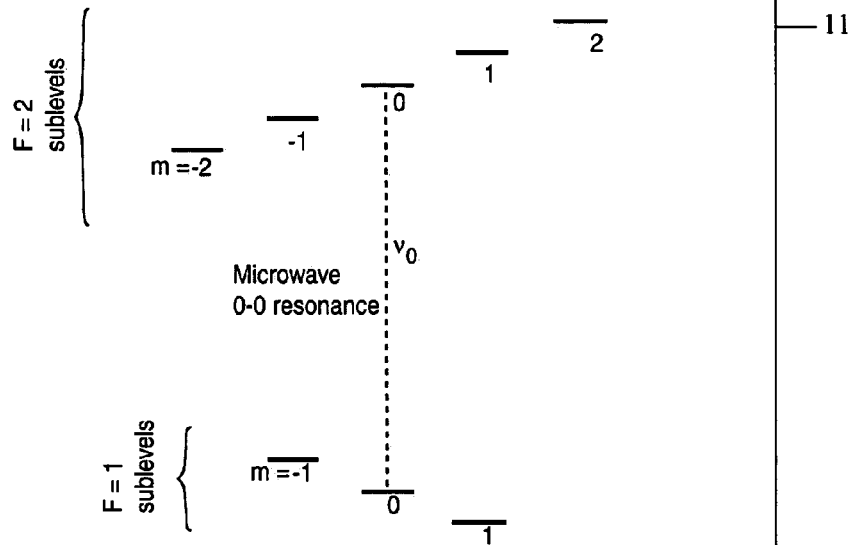
FIG. 3 is a flow diagram of a method of operating an atomic clock or magnetometer in accordance with the teachings of the present invention.

FIG. 3 is a flow diagram of a method for operating an atomic clock or magnetometer 10 in accordance with the teachings of the present invention. In block 11, atoms are generated in a vapor phase or in an atomic beam, their ground state split by the electron-nuclear hyperfine interaction. The atomic vapor can be mixed with a buffer gas or gases, such as nitrogen or any of the noble gases, or a mixture thereof. A weak external magnetic field is needed to define the quantization direction at the location of the atoms. The quantum numbers F and m are used to label the ground-state sublevels of the alkali-metal atom. Here F is a quantum number of the total spin, electron plus nuclear, of the atom, and m, is the azimuthal quantum number, the projection of the total spin along the direction of the magnetic field. The possible values of F are F=I+1/2=a or F=I−1/2=b, and the possible values of m are m=F,F−1, F−2, . . . −F.

In block 12, to excite coherent population trapping (CPT) 0-0 resonances in alkali-metal vapors, the alkali-metal atoms in the ground state are optically pumped with light of alternating polarization. The light of alternating polarization provides photons having spin that alternates its direction at a hyperfine frequency of the atoms at the location of the atoms. Light of alternating polarization is defined within the scope of this invention as an optical field, the electric field vector of which or some component thereof at the location of the atoms alternates at a hyperfine frequency of the atoms between rotating clockwise and rotating counter-clockwise in the plane perpendicular to the magnetic field direction. In one embodiment, the polarization of the light interacting with the atoms alternates from magnetic right circular polarization (mRCP) to magnetic left circular polarization (mLCP). mRCP light is defined as light for which the mean photon spin points along the direction of the magnetic field so that an absorbed photon increases the azimuthal angular momentum of the atom by 1 (in units of $\hbar$). mLCP is defined as light for which the mean photon spin points antiparallel to the direction of the magnetic field so that an absorbed photon decreases the azimuthal angular momentum of the atom by 1 (in units of $\hbar$). For light beams propagating antiparallel to the magnetic field direction, mRCP and mLCP definitions are equivalent to the commonly used RCP and LCP definitions, respectively. However, for light beams propagating along the magnetic field direction, mRCP is equivalent to LCP, and mLCP is equivalent to RCP. In one embodiment, block 12 is performed by intensity or frequency modulating right circularly polarized (RCP) light at a repetition frequency equal to the frequency of the 0-0 resonance and combining it with similarly modulated left circularly polarized (LCP) light which is shifted or delayed relative to the RCP light by a half-integer multiple of the repetition period. Alternatively, the light of alternating polarization is generated by combining two beams of mutually perpendicular linear polarizations, wherein optical frequencies of the beams differ from each other by a hyperfine frequency of the atoms. Alternatively, the light of alternating polarization is generated by two counter-propagating beams that produce the electrical field vector at the location of the atoms which alternates at a hyperfine frequency of the atoms between rotating clockwise and rotating counter-clockwise in the plane perpendicular to the light propagation. Alternatively, the light of alternating polarization is generated by a system of spectral lines, equally spaced in frequency by a hyperfine frequency of the atoms wherein each spectral line is linearly polarized and the polarizations of adjacent lines are mutually orthogonal. Alternatively, the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms.

In block 14, detection of transmission of the light through the alkali-metal vapor is measured. For example, a photo detector can be used to measure transmission of the light through a glass cell containing the alkali-metal vapor and a buffer gas. Alternatively, fluorescence of the alkali-metal vapor is measured. Alternatively, atomic state of the alkali-metal atoms in an atomic beam is analyzed using standard methods. Method 10 can be used to improve performance of gas-cell atomic clocks, atomic beam clocks, atomic fountain clocks and magnetometers.

Figure 4A:
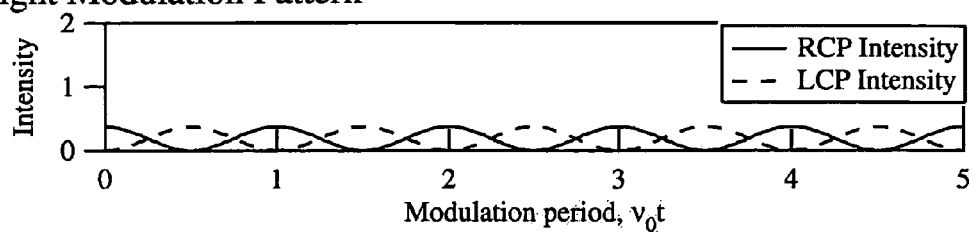
FIG. 4A is a schematic diagram of a light modulation pattern of intensity modulated right circular polarization (RCP) and left circular polarization (LCP) components of D1 pumping light of alternating polarization.
Figure 4B:
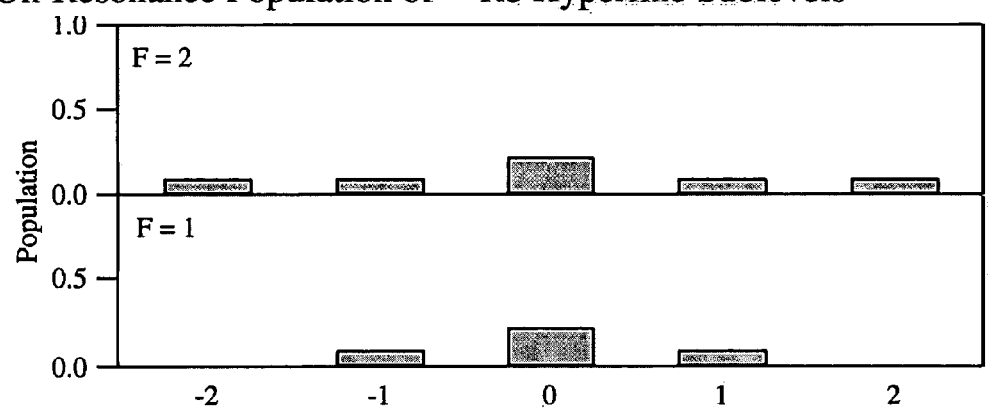
FIG. 4B is a schematic diagram of the population distribution.
Figure 4C:
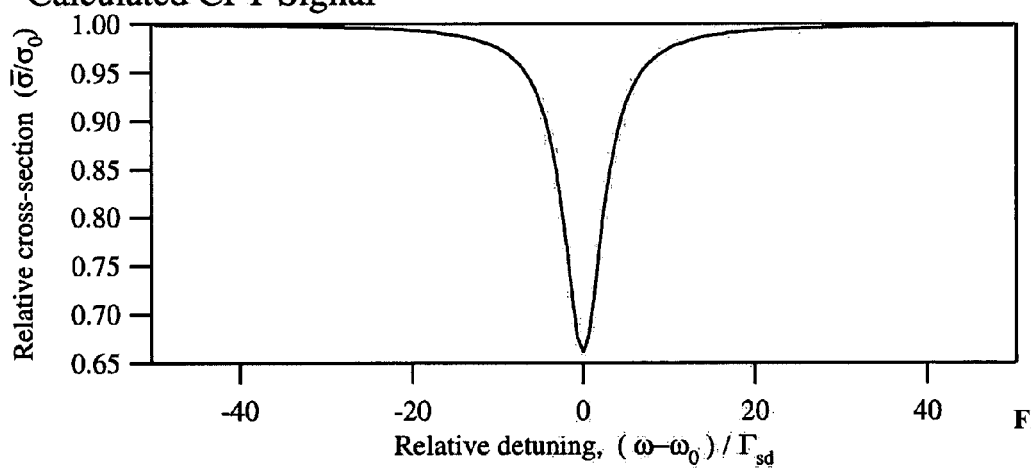
FIG. 4C is a calculation of the enhancement of CPT resonance at low buffer-gas pressure by using two-wave pumping with alternating polarization.

FIGS. 4A–C illustrate detailed modeling calculation of population distributions and 0-0 CPT resonance for $^{87}$Rb at low gas pressure excited with intensity modulated light of alternating polarization. Here, the low gas pressure is defined by the optical pressure broadening being much less than ground-state hyperfine splitting. The light modulation pattern of the intensity modulated RCP light and LCP light is shown in FIG. 4A. In low-pressure regime, alkali-metal atoms can only interact with two coherent light frequencies. Hence, it is sufficient to use the pumping light with sinusoidally alternating circular polarization to enhance the 0-0 CPT resonance. It can be referred to as two-wave push-pull pumping. Calculations show, that in the limit of high optical power, where the optical pumping rate dominates all relaxation rates, two-wave push-pull pumping in low-pressure regime can concentrate 100% of the atoms in the m=0 states, the initial and final states of the 0-0 resonance.

Figure 5:
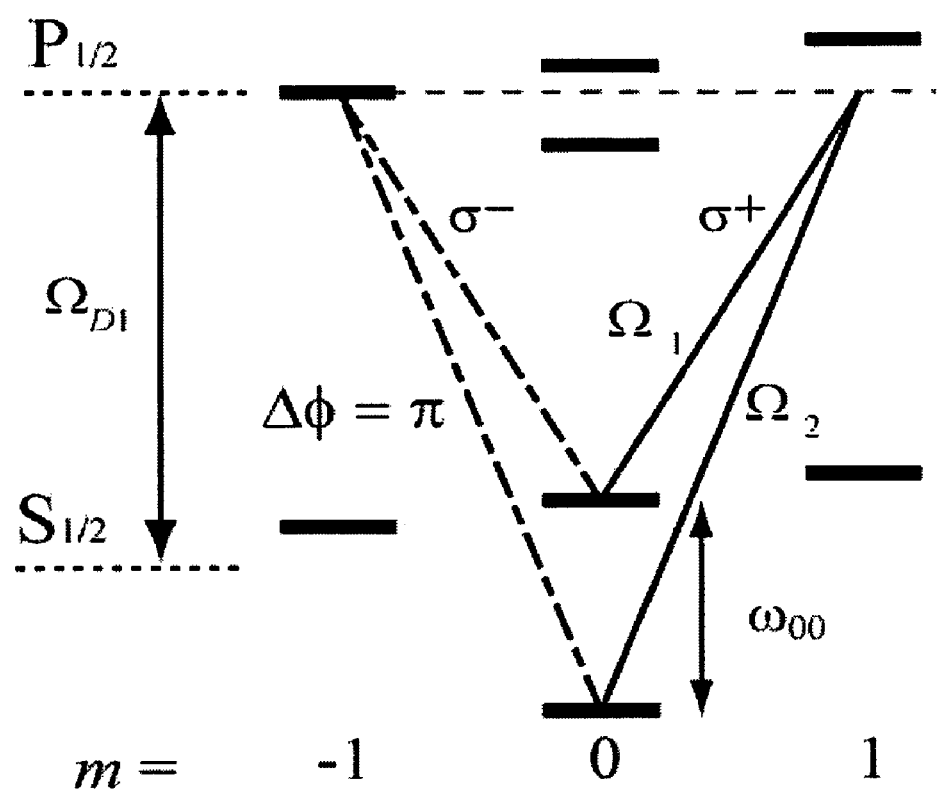
FIG. 5 is an energy-level diagram of a hypothetical atom with nuclear spin I=1/2 undergoing two-wave push-pull pumping with light of alternating polarization at low buffer-gas pressure.

FIG. 5 illustrates a two-wave push-pull pumping by using an energy-level diagram of a hypothetical atom with nuclear spin I=1/2. The two-wave push-pull pumping is equivalent to two Λ-pumping schemes. Two Λ transitions have the opposite circular polarizations, but there is a time delay, equal to half the hyperfine period, between them. To optimize the signal contrast, one should use equal intensities of the two pumping waves, connecting two ground-state multiplets, separated by the hyperfine frequency, to the excited state. If the intensities of the two waves are different, atoms can still be pumped into the m=0 states, but the relative populations of the two m=0 states are different. In this case, the pumping light is alternating between right and left elliptical polarization states.

Figure 6A:
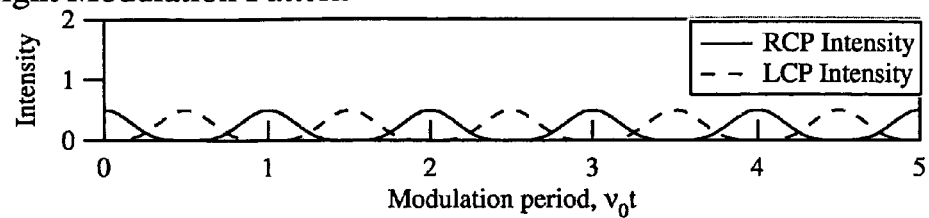
FIG. 6A is a schematic diagram of a light modulation pattern (given by $R=\Gamma_{op}(2^p p!)^2[2(2p)!]^{-1} \cos^{2p} \pi v_0 t$ with p=2) of intensity modulated right-circular-polarization (RCP) and left-circular-polarization (LCP) components of the D1 pumping light of alternating polarization.
Figure 6B:
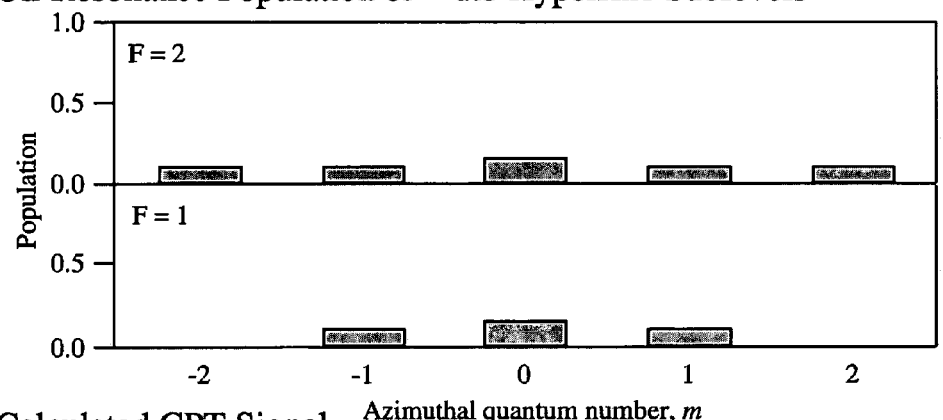
FIG. 6B is a schematic diagram of the atomic population distribution among the ground-state sublevels at high gas pressure for the light modulation pattern of FIG. 6A.
Figure 6C:
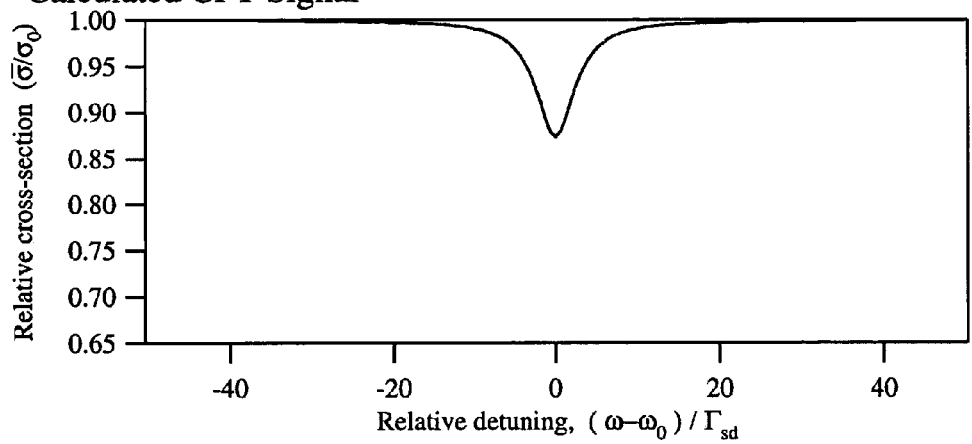
FIG. 6C is a schematic diagram of the calculated CPT resonance at high gas pressure in the time-averaged absorption cross section $\bar{\sigma}$, which is plotted in units of the absorption cross section $\sigma_0$ of completely unpolarized atoms for the light modulation pattern of FIG. 5A.

FIGS. 6A–C illustrate detailed modeling calculations of population distributions and 0-0 CPT resonances for $^{87}$Rb at high gas pressure excited with intensity modulated light of alternating circular polarization. Here, the high gas pressure is defined by the optical pressure broadening being much larger than the ground-state hyperfine splitting. The light modulation pattern of the intensity modulated RCP light and LCP light is shown in FIG. 6A. It is set so that the time averaged optical power is the same as in FIGS. 2A–C. Because the time-averaged spin of the photons is zero, there is no tendency to pump the atoms towards either end state, and in fact, the atoms tend to accumulate in the initial and final states of the 0-0 transition, shown in FIG. 6B. The CPT signal is enhanced by a factor of about 40 in FIG. 6C compared to pumping with light of fixed circular polarization and the same average intensity as shown in FIG. 2C. Compared to 0-0 CPT with fixed circular polarization (shown in FIGS. 2A–C), there is less light transmission in method 10 of the present invention (with alternating circular polarization) when the modulation frequency of the light is off resonance. There is no optical pumping, and the time-averaged, photon-absorption cross section, $\overline{\sigma}$, is equal to the cross section $\sigma_0$ of unpolarized atoms. The decrease in the time averages cross section at resonance is about 10 to about 100 times larger for CPT with alternating circular polarization shown in FIGS. 6A–C than for CPT with fixed circular polarization, shown in FIGS. 2A–C.

In an alternate embodiment, block 12 is performed by pumping with light pulses of RCP light and LCP light having a pulse width that is less than one half of the modulation period $T=1/v_0$. It has been found that to gain the advantages of short-pulse pumping, the optical line broadening by the buffer gas must be large enough such that the atoms can absorb most of the optical frequency side bands of the periodic train of short pulses.

In this embodiment, the cells of the alkali-metal vapor have very high gas pressure, sufficient to induce optical absorption linewidths much larger than the 0-0 hyperfine frequency $v_0$.

Figure 7A:
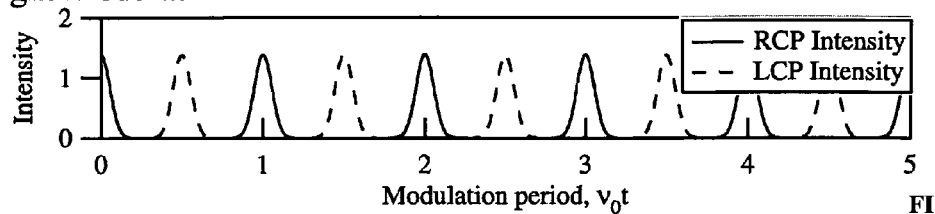
FIG. 7A is a schematic diagram of a light modulation pattern of intensity modulated right-circular-polarization (RCP) and left-circular-polarization (LCP) components of the D1 pumping light of alternating polarization having light pulses that are much shorter than the modulation period.
Figure 7B:
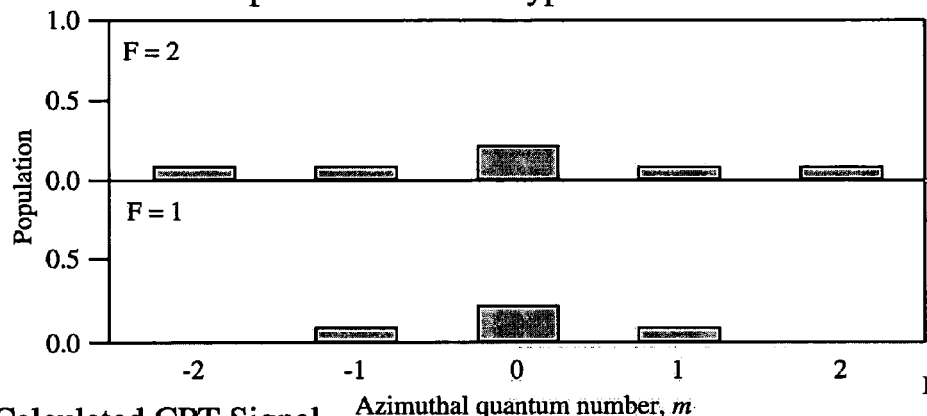
FIG. 7B is a schematic diagram of the atomic population distribution among the ground-state sublevels at high gas pressure for the light modulation pattern of FIG. 7A.
Figure 7C:
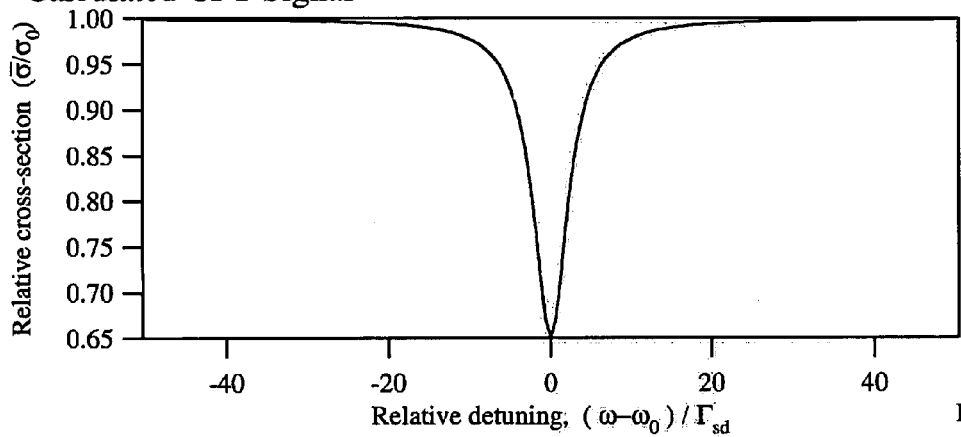
FIG. 7C is a schematic diagram of the enhanced, calculated CPT resonance at high gas pressure in the time-averaged absorption cross section $\bar{\sigma}$, which is plotted in units of the absorption cross section $\sigma_0$ of completely unpolarized atoms for the light modulation pattern of FIG. 7A.

FIGS. 7A–C show pumping with light pulses that are much shorter than one half of the modulation period, but have the same average light intensity as in FIGS. 6A and 2A. The optical line is assumed to be sufficiently pressure-broadened that the atoms can absorb all of the sidebands of the modulated light. The higher population concentration in the initial and final states of the 0-0 transition also leads to a modest suppression of the spin-exchange linewidth broadening, thereby rendering a somewhat narrower CPT resonance signal at high alkali-metal vapor densities, as shown in FIGS. 7B and 7C. The CPT signal shown in FIG. 7C is enhanced by a factor of about 120 compared to pumping with light of fixed circular polarization and the same average intensity that is shown in FIG. 2C. Theoretically, when the buffer-gas pressure is high enough to cause a very broad linewidth $\gamma_{op}$ of optical absorption, such that $\gamma_{op}/\pi \gg v_0$, we can calculate the optimized temporal width of the light pulse to be $$\frac{8^{1/4}}{\pi}\sqrt{\frac{2\pi v_0}{\gamma_{op}}}\, T_0,$$

where $T_0$ is the hyperfine period $1/v_0$. At buffer gas pressures causing an optical line broadening comparable to the hyperfine splitting frequency, $\gamma_{op}/\pi \sim v_0$, it is possible to calculate the shape of the modulation waveform that will optimize the performance of the atomic clock or magnetometer.

Figure 2B:
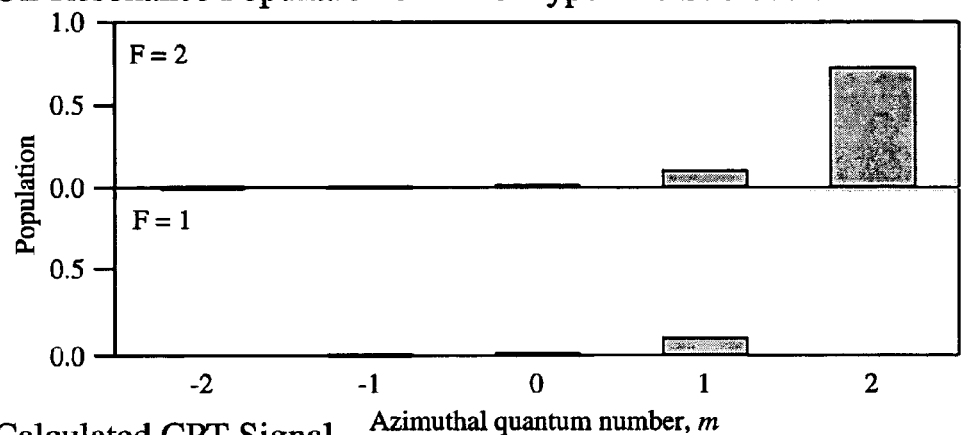
FIG. 2B is a schematic diagram of the atomic population distribution among the ground-state sublevels for the light modulation pattern of FIG. 2A.
Figure 2C:
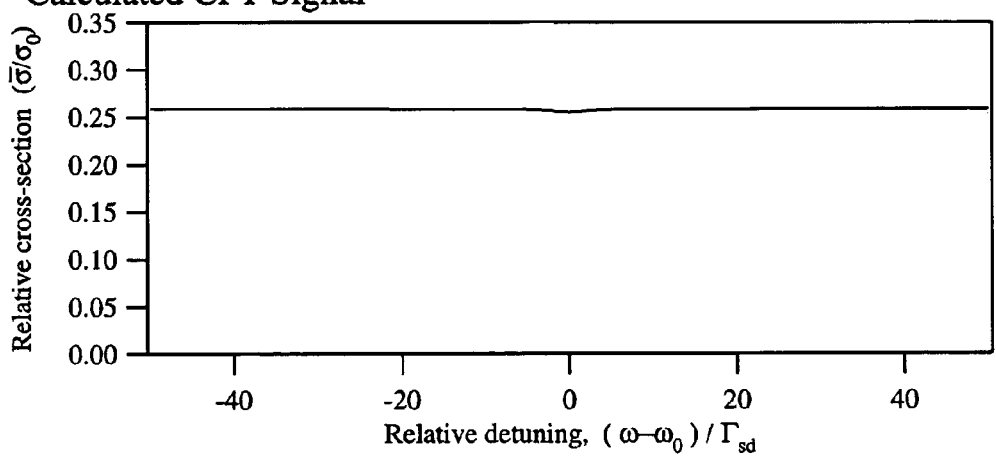
FIG. 2C is a schematic diagram of the calculated CPT resonance in the time-averaged absorption cross section $\bar{\sigma}$, which is plotted in units of the absorption cross section $\sigma_0$ of completely unpolarized atoms for the light modulation pattern of FIG. 2A.

The modeling calculation of FIGS. 4A–C shows the CPT signal in a low pressure regime with the same pumping and relaxation conditions which are used in FIGS. 2A–C, $\Gamma_{op}=3\Gamma_{sd}$ and $\Gamma_d=0.01\Gamma_{sd}$. The instantaneous pumping rate of the RCP light was assumed to have the time dependence $R=\Gamma_{op}(2^p p!)^2 [2(2p)!]^{-1} \cos^{2p} \pi v_0 t$ with p=1. The instantaneous pumping rate L of the LCP light was identical to that of the RCP light, except that it was shifted by half a modulation period T in time, that is, $L(t)=R(t-T/2)$.

The modeling calculations of FIGS. 6A–C and 7A–C show the CPT signals in a high pressure regime with the same pumping and relaxation conditions, which are used in FIGS. 2A–C, $\Gamma_{op}=3\Gamma_{sd}$ and $\Gamma_d=0.01\Gamma_{sd}$. The instantaneous pumping rate of the RCP light was assumed to have the time dependence $R=\Gamma_{op}(2^p p!)^2 [2(2p)!]^{-1} \cos^{2p} \pi v_0 t$ with p=2 for FIGS. 6A–C and p=17 for FIGS. 7A–C. The instantaneous pumping rate L of the LCP light was identical to that of the RCP light, except that it was shifted by half a modulation period T in time, that is, $L(t)=R(t-T/2)$.

In one particular embodiment, the light of alternating circular polarization is provided by merged beams of right circularly polarized (RCP) light and left circular polarized (LCP) light. Each beam is intensity-modulated at the 0-0 hyperfine frequency $v_0$ such that the intensity peaks of the LCP light follow those of the RCP light by half a modulation period, $1/2v_0$. Alternatively, each beam is frequency-modulated at half the 0-0 hyperfine frequency $v_0/2$, such that the frequency maxima of the LCP light follow those of the RCP light by half a modulation period, $1/2v_0$. The carrier frequency or frequencies are adjusted to ensure that coherent sidebands of the light can excite the same Zeeman multiplet or multiplets of the excited state from both the upper and lower sublevels of the 0-0 resonance. This embodiment is useful for atomic beams, atomic fountains or gas cells with low enough gas pressure that the 0-0 splitting of the optical absorption line remains well resolved.

Figure 8:
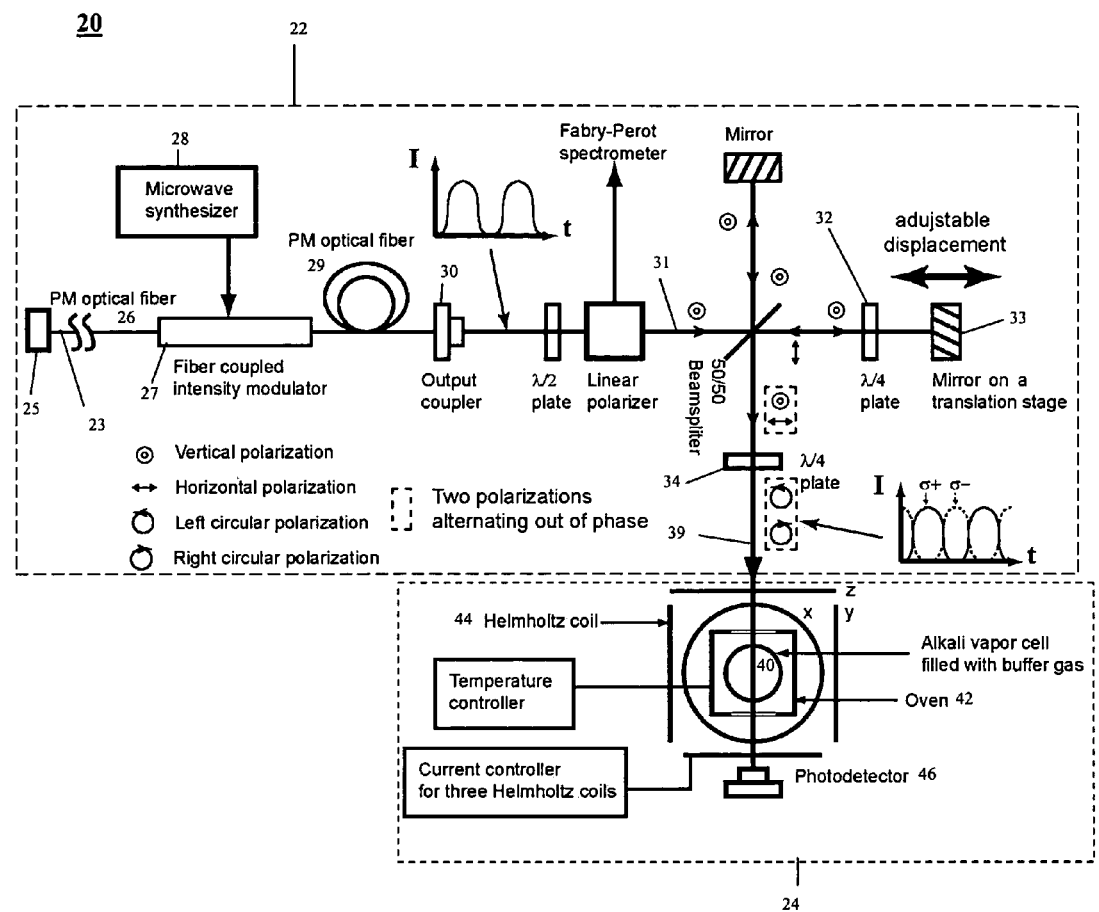
FIG. 8 is a schematic diagram of one possible embodiment of a system for operating an atomic clock or magnetometer.

FIG. 8 is a schematic diagram of a system for operating an atomic clock 20 in accordance with the teachings of the present invention. System 20 comprises light-modulation unit 22 and CPT signal-detection unit 24. In light modulation unit 22, nearly monochromatic light 23 is generated by diode-laser system 25, tuned to the D1 line of $^{87}$Rb, and launched into a polarization maintaining (PM) optical fiber 26. PM fiber 26 connects to the input of intensity modulator 27. For example, intensity modulator 27 can be a commercial Mach-Zehnder modulator. In intensity modulator 27, light 23 is amplitude-modulated by a microwave signal from digital microwave synthesizer 28.

Output from intensity modulator 27 couples to the PM optical fiber 29 and is collimated into a parallel beam by the output coupler 30.

In order to obtain alternating circular polarization, light beam 31 is split and sent along two different paths. The light in each path is polarized separately into either RCP or LCP, by using appropriate optics. In one embodiment, the sub-beam in one path passes twice through a λ/4 phase retardation plate 32, which converts the linear polarization from vertical to horizontal. The adjustable displacement of the mirror 33 introduces the delay of half the hyperfine period in one of the two sub-beams. For example, for $^{87}$Rb, the 0-0 resonance frequency is $v_{00}$=6.84 GHz and the microwave wavelength is $\lambda_{00}$=4.39 cm, so a displacement of the mirror 33 by $\lambda/4$=1.1 cm shifts the intensity peaks of one beam by half a hyperfine period with respect to the peaks of the other. The output beams, now in orthogonal states of linear polarization, are combined and passed through a second λ/4 plate 34, introduced to guarantee that the exiting beam of light is alternating between the states of right and left circular polarization. Generally, one light path can be longer than the other by (n+1/2)Λ where $\Lambda = c/v_0$ is the microwave wavelength and n=0,±1, . . . is an integer. A delay of half a clock cycle can be introduced between the paths by using linear polarizers and mirrors. The beams are recombined so that they emerge as a single beam of alternating circular polarization 39.

Modulated beam of alternating circular polarization 39 is sent to cell 40 containing $^{87}$Rb vapor and a buffer gas of CPT signal-detection unit 24. Cell 40 contains an active medium. For example, cell 40 can contain cesium (Cs) or rubidium (Rb) vapor and buffer gas or gasses. Cell 40 is heated by oven 42. The magnetic field within cell 40 can be controlled by one or more coil pairs 44. For example, a set of three coil pairs 44 can be used to control the magnetic field. The transmission of light through cell 40 is measured by a photo-detector 46. The CPT signal is observed when the modulation frequency is slowly swept through the resonance frequency of the alkali vapor.

Figure 9:
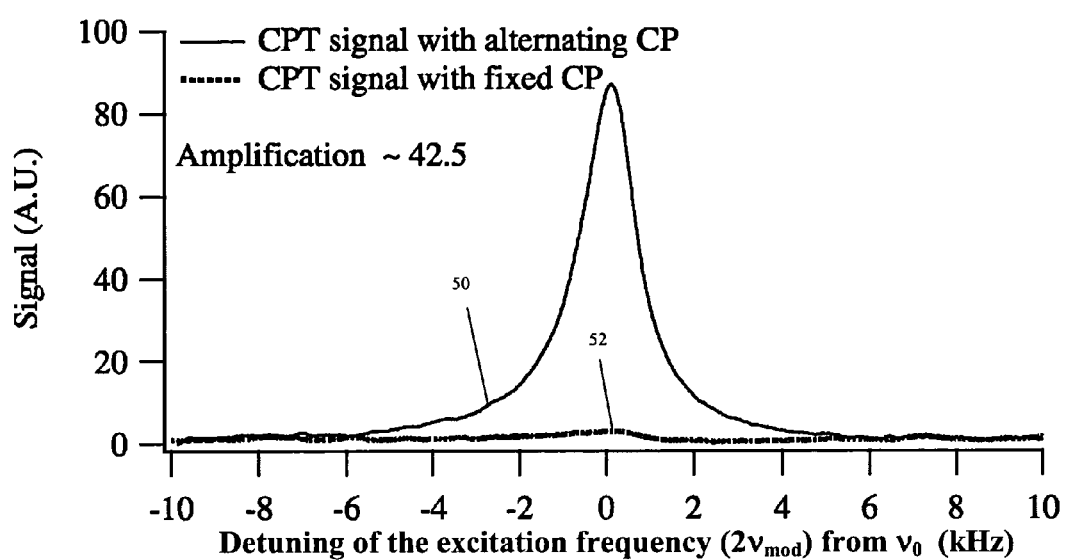
FIG. 9 is a plot of the measured signal increase of 0-0 CPT resonance excited by light of alternating polarization produced with the system of FIG. 8.

FIG. 9 shows a measurement of 0-0 CPT resonance 50, excited by light of alternating circular polarization produced with the apparatus of FIG. 8, and also a measurement of 0-0 CPT resonance 52 excited by intensity modulated light of the same average intensity having conventional fixed circular polarization.

The intensity of the modulating power (at frequency $v_{mod}$=$v_0$/2, half the hyperfine frequency), the static voltage bias of the two arms of the Mach-Zehnder modulator 27 and the laser carrier frequency were adjusted to maximize the CPT signal. Cell 40 contained isotopically enriched $^{87}$Rb and nitrogen buffer gas at a room-temperature pressure of 1 atmosphere. The modulation frequency $v_{mod}$ was swept from 5 kHz below the resonance to 5 kHz above. The average transparency of the vapor increased on resonance, and the increase was 42.5 times greater for light of alternating circular polarization 50 than for light of fixed circular polarization 52.

The signals, obtained at 75° C. from a cell with a 2 cm optical path, are the time-averaged transmission of the cell, minus the "baseline," the transmission when the modulation frequency is well off resonance. Since the signal is proportional to the transmission of the vapor, it has the opposite sign from the time-averaged absorption cross-sections, plotted on FIGS. 2A–C, 4A–C, 6A–C, and 7A–C. Resonance "contrasts" are defined as the ratio of the signal to the baseline. The experimentally observed 0-0 resonance amplitude is 42.5 times larger when the atoms are pumped with light of alternating circular polarization, produced with system 20 of FIG. 8, than when pumped with intensity-modulated light of fixed circular polarization. The resonances were produced with light of nearly the same average power.

It is to be understood that the above-described embodiments are illustrative of only a few of the many possible specific embodiments that can represent applications of the principles of the invention. Numerous and varied other arrangements can be readily devised in accordance with these principles by those skilled in the art without departing from the spirit and scope of the invention.

What is claimed is:

1. A method for operating an atomic clock comprising the steps of:
    generating atoms in the vapor phase or in an atomic beam within a region of weak external magnetic field and exciting hyperfine transitions in the atoms by pumping them with light of alternating polarization, characterized by photon spin that alternates in direction at a hyperfine frequency of the atoms at the location of the atoms.

2. The method of claim 1 wherein the polarization of the light interacting with the atoms alternates between the states of right and left circular polarization at a hyperfine frequency of the atoms.

3. The method of claim 1 wherein the light of alternating polarization is generated by intensity or frequency modulation of right circularly polarized (RCP) light combined with similarly modulated left circularly polarized (LCP) light that is shifted or delayed with respect to the right circularly polarized light by a half-integer multiple of a hyperfine period of the atoms.

4. The method of claim 1 wherein the light of alternating polarization is generated by combining two beams of mutually perpendicular linear polarizations, wherein optical frequencies of said beams differ by a hyperfine frequency of the atoms.

5. The method of claim 1 wherein the light of alternating polarization is generated by two counter-propagating beams, producing the electrical field vector or a component thereof that alternates at a hyperfine frequency of the atoms between rotating clockwise and rotating counter-clockwise in the plane perpendicular to the magnetic field direction at the location of the atoms.

6. The method of claim 1 wherein the light of alternating polarization is generated by a system of spectral lines, equally spaced in frequency by a hyperfine frequency of the atoms wherein each spectral line is linearly polarized, and polarizations of adjacent lines are mutually orthogonal.

7. The method of claim 1 wherein the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms, and the atoms interacting with the light are mixed with a buffer gas producing an optical pressure broadening which is less than the ground-state hyperfine splitting frequency $v_{00}$.

8. The method of claim 1 wherein the light of alternating polarization is generated by generating pulses in intensity of right circular polarized light interspersed with pulses of left circularly polarized light and said pulses having a pulse width on the order of or less than one half of a hyperfine modulation period.

9. The method of claim 1 wherein the light of alternating polarization is formed of merged beams of a first beam of right circularly polarized light and a second beam left circularly polarized light, said first beam and said second beam are intensity modulated at a hyperfine frequency of the atoms such that intensity peaks of the left circularly polarized light follow intensity peaks of the right circularly polarized light by half a modulation period.

10. The method of claim 1 wherein the light of alternating polarization is formed of merged beams of a first beam of right circularly polarized light and a second beam left circularly polarized light, said first beam and said second beam are frequency modulated at half of a hyperfine frequency of the atoms such that a frequency maxima of the left circularly polarized light follow a frequency maxima of the right circularly polarized light by half a hyperfine period of the atoms.

11. The method of claim 1 wherein the light of alternating polarization is generated by the steps of:
  splitting a modulated or pulsed light beam into a first path and a second path;
  polarizing light in the first path into right circularly polarized light;
  polarizing light in the second path into left circularly polarized light;
  introducing a delay of a half-integer multiple of a hyperfine period between the right circularly polarized light in the first path and the left circularly polarized light in the second path; and
  recombining the first path and the second path.

12. The method of claim 1 wherein the light of alternating polarization is generated, or is composed of beams that are generated, by modulating the sources of said light with a waveform pattern or patterns that is shaped to optimize the performance of the atomic clock.

13. The method of claim 1 further comprising the step of:
  detecting transmission of the light of alternating polarization through a medium including the atoms.

14. The method of claim 1 further comprising the step of:
  detecting fluorescence of the atoms excited by the light of alternating polarization.

15. The method of claim 1 further comprising the step of:
  analyzing the atomic state of the alkali-metal atoms in an atomic beam, irradiated with the light of alternating polarization.

16. The method of claim 1 wherein the atoms are rubidium atoms or cesium atoms.

17. A system for operating an atomic clock comprising:
  means for generating atoms in the vapor phase or in an atomic beam within a region of weak external magnetic field; and
  means for exciting hyperfine transitions in the atoms by pumping them with light of alternating polarization, characterized by photon spin that alternates in direction at a hyperfine frequency of the atoms at the location of the atoms.

18. The system of claim 17 wherein the polarization of the light interacting with the atoms alternates between the states of right and left circular polarization at a hyperfine frequency of the atoms.

19. The system of claim 17 wherein the light of alternating polarization is generated by intensity or frequency modulation of right circularly polarized (RCP) light combined with similarly modulated left circularly polarized (LCP) light that is shifted or delayed with respect to the right circularly polarized light by a half-integer multiple of a hyperfine period of the atoms.

20. The system of claim 17 wherein the light of alternating polarization is generated by combining two beams of mutually perpendicular linear polarizations, wherein optical frequencies of said beams differ by a hyperfine frequency of the atoms.

21. The system of claim 17 wherein the light of alternating polarization is generated by two counter-propagating beams, producing the electrical field vector or a component thereof that alternates at a hyperfine frequency of the atoms between rotating clockwise and rotating counter-clockwise in the plane perpendicular to the magnetic field direction at the location of the atoms.

22. The system of claim 17 wherein the light of alternating polarization is generated by a system of spectral lines, equally spaced in frequency by a hyperfine frequency of the atoms wherein each spectral line is linearly polarized, and polarizations of adjacent lines are mutually orthogonal.

23. The system of claim 17 wherein the light of alternating polarization is generated by means for generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms, and the atoms interacting with the light are mixed with a buffer gas producing an optical pressure broadening which is less than the ground-state hyperfine splitting frequency $v_{00}$.

24. The system of claim 17 wherein the light of alternating polarization is generated by means for generating pulses in intensity of right circular polarized light interspersed with pulses of left circularly polarized light and said pulses having a pulse width on the order of or less than one half of a hyperfine modulation period.

25. The system of claim 17 wherein the light of alternating polarization is formed of merged beams of a first beam of right circularly polarized light and a second beam left circularly polarized light, said first beam and said second beam are intensity modulated at a hyperfine frequency of the atoms such that intensity peaks of the left circularly polarized light follow intensity peaks of the right circularly polarized light by half a modulation period.

26. The system of claim 17 wherein the light of alternating polarization is formed of merged beams of a first beam of right circularly polarized light and a second beam left circularly polarized light, said first beam and said second beam are frequency modulated at half of a hyperfine frequency of the atoms such that a frequency maxima of the left circularly polarized light follow a frequency maxima of the right circularly polarized light by half a hyperfine period of the atoms.

27. The system of claim 17 wherein the light of alternating polarization is generated by:

means for splitting a modulated or pulsed light beam into a first path and a second path;

means for polarizing light in the first path into right circularly polarized light;

means for polarizing light in the second path into left circularly polarized light;

means for introducing a delay of a half-integer multiple of a hyperfine period between the right circularly polarized light in the first path and the left circularly polarized light in the second path; and means for recombining the first path and the second path.

28. The system of claim 17 wherein the light of alternating polarization is generated, or is composed of beams that are generated, by modulating the sources of said light with a waveform pattern or patterns that is shaped to optimize the performance of the atomic clock.

29. The system of claim 17 further comprising:
means for detecting transition of the light of alternating polarization through a medium including the atoms.

30. The system of claim 17 further comprising:
means for detecting fluorescence of the atoms excited by the light of alternating polarization.

31. The system of claim 17 further comprising:
means for analyzing the atomic state of the alkali-metal atoms in an atomic beam, irradiated with the light of alternating polarization.

32. The system of claim 17 wherein the atoms are rubidium atoms or cesium atoms.

33. A system for operating an atomic clock comprising:
a cell of alkali metal vapor;
means for applying light of alternating polarization to said cell to excite hyperfine transitions of atoms of said vapor.

34. The system of claim 33 wherein the polarization of the light interacting with the atoms alternates between the states of right and left circular polarization at a hyperfine frequency of the atoms.

35. The system of claim 33 wherein the light of alternating polarization is generated by intensity or frequency modulation of right circularly polarized (RCP) light combined with similarly modulated left circularly polarized (LCP) light that is shifted or delayed with respect to the right circularly polarized light by a half-integer multiple of a hyperfine period of the atoms.

36. The system of claim 33 wherein the light of alternating polarization is generated by combining two beams of mutually perpendicular linear polarizations, wherein optical frequencies of said beams differ by a hyperfine frequency of the atoms.

37. The system of claim 33 wherein the light of alternating polarization is generated by two counter-propagating beams, producing the electrical field vector or a component thereof that alternates at a hyperfine frequency of the atoms between rotating clockwise and rotating counter-clockwise in the plane perpendicular to the magnetic field direction at the location of the atoms.

38. The system of claim 33 wherein the light of alternating polarization is generated by a system of spectral lines, equally spaced in frequency by a hyperfine frequency of the atoms wherein each spectral line is linearly polarized, and polarizations of adjacent lines are mutually orthogonal.

39. The system of claim 33 wherein the light of alternating polarization is generated by means for generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms, and the atoms interacting with the light are mixed with a buffer gas producing an optical pressure broadening which is less than the ground-state hyperfine splitting frequency $v_{00}$.

40. The system of claim 33 wherein the light of alternating polarization is generated by means for generating pulses in intensity of right circular polarized light interspersed with pulses of left circularly polarized light and said pulses having a pulse width on the order of or less than one half of a hyperfine modulation period.

41. The system of claim 33 wherein the light of alternating polarization is formed of merged beams of a first beam of right circularly polarized light and a second beam left circularly polarized light, said first beam and said second beam are intensity modulated at a hyperfine frequency of the atoms such that intensity peaks of the left circularly polarized light follow intensity peaks of the right circularly polarized light by half a modulation period.

42. The system of claim 33 wherein the light of alternating polarization is formed of merged beams of a first beam of right circularly polarized light and a second beam left circularly polarized light, said first beam and said second beam are frequency modulated at half of a hyperfine frequency of the atoms such that a frequency maxima of the left circularly polarized light follow a frequency maxima of the right circularly polarized light by half a hyperfine period of the atoms.

43. The system of claim 33 wherein the light of alternating polarization is generated by:
means for splitting a modulated or pulsed light beam into a first path and a second path;
means for polarizing light in the first path into right circularly polarized light;
means for polarizing light in the second path into left circularly polarized light;
means for introducing a delay of a half-integer multiple of a hyperfine period between the right circularly polarized light in the first path and the left circularly polarized light in the second path; and
means for recombining the first path and the second path.

44. The system of claim 33 further comprising:
means for detecting transmission of the light of alternating polarization through a medium including the atoms.

45. The system of claim 33 further comprising:
means for detecting fluorescence of the atoms excited by the light of alternating polarization.

46. The system of claim 33 wherein the light of alternating polarization is generated, or is composed of beams that are generated, by modulating the sources of said light with a waveform pattern or patterns that is shaped to optimize the performance of the atomic clock.

47. The system of claim 33 wherein the atoms are rubidium atoms or cesium atoms.

48. The system of claim 33 further comprising:
means for controlling a magnetic filed within said cell.

49. The system of claim 33 further comprising:
means for heating said cell.

50. A method for operating magnetometer comprising the steps of:
generating atoms in the vapor phase or in an atomic beam within a region of magnetic field to be measured and exciting hyperfine transitions in the atoms by pumping them with light of alternating circular polarization characterized by photon spin that alternates in direction at a hyperfine frequency of the atoms at the location of the atoms.

51. The method of claim 50 wherein the polarization of the light interacting with the atoms alternates between the states of right and left circular polarization at a hyperfine frequency of the atoms.

52. The method of claim 50 wherein the light of alternating polarization is generated by intensity or frequency modulation of right circularly polarized (RCP) light combined with similarly modulated left circularly polarized (LCP) light that is shifted or delayed with respect to the right circularly polarized light by a half-integer multiple of a hyperfine period of the atoms.

53. The method of claim 50 wherein the light of alternating polarization is generated by combining two beams of mutually perpendicular linear polarizations, wherein optical frequencies of said beams differ by a hyperfine frequency of the atoms.

54. The method of claim 50 wherein the light of alternating polarization is generated by two counter-propagating beams, producing the electrical field vector or a component thereof that alternates at a hyperfine frequency of the atoms between rotating clockwise and rotating counter-clockwise in the plane perpendicular to the magnetic field direction at the location of the atoms.

55. The method of claim 50 wherein the light of alternating polarization is generated by a system of spectral lines, equally spaced in frequency by a hyperfine frequency of the atoms wherein each spectral line is linearly polarized, and polarizations of adjacent lines are mutually orthogonal.

56. The method of claim 50 wherein the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms, and the atoms interacting with the light are mixed with a buffer gas producing an optical pressure broadening which is less than the ground-state hyperfine splitting frequency $v_{00}$.

57. The method of claim 50 wherein the light of alternating polarization is generated by generating pulses in intensity of right circular polarized light interspersed with pulses of left circularly polarized light and said pulses having a pulse width on the order of or less than one half of a hyperfine modulation period.

58. The method of claim 50 wherein the light of alternating polarization is formed of merged beams of a first beam of right circularly polarized light and a second beam left circularly polarized light, said first beam and said second beam are intensity modulated at a hyperfine frequency of the atoms such that intensity peaks of the left circularly polarized light follow intensity peaks of the right circularly polarized light by half a modulation period.

59. The method of claim 50 wherein the light of alternating polarization is formed of merged beams of a first beam of right circularly polarized light and a second beam left circularly polarized light, said first beam and said second beam are frequency modulated at half of a hyperfine frequency of the atoms such that a frequency maxima of the left circularly polarized light follow a frequency maxima of the right circularly polarized light by half a hyperfine period of the atoms.

60. The method of claim 50 wherein the light of alternating polarization is generated by the steps of:
splitting a modulated or pulsed light beam into a first path and a second path;
polarizing light in the first path into right circularly polarized light;
polarizing light in the second path into left circularly polarized light;
introducing a delay of a half-integer multiple of a hyperfine period between the right circularly polarized light in the first path and the left circularly polarized light in the second path; and
recombining the first path and the second path.

61. The method of claim 50 wherein the light of alternating polarization is generated, or is composed of beams that are generated, by modulating the sources of said light with a waveform pattern or patterns that is shaped to optimize the performance of the magnetometer.

62. The method of claim 50 further comprising the step of:
detecting transmission of the light of alternating polarization through a medium including the atoms.

63. The method of claim 50 further comprising the step of:
detecting fluorescence of the atoms excited by the light of alternating polarization.

64. The method of claim 50 further comprising the step of:
analyzing the atomic state of the alkali-metal atoms in an atomic beam, irradiated with the light of alternating polarization.

65. The method of claim 50 wherein the atoms are rubidium atoms or cesium atoms.

66. A system for operating a magnetometer comprising:
means for generating atoms in the vapor phase or in an atomic beam within a region of weak external magnetic field; and
means for exciting hyperfine transitions in the atoms by pumping them with light of alternating polarization, characterized by photon spin that alternates in direction at a hyperfine frequency of the atoms at the location of the atoms.

67. The system of claim 66 wherein the polarization of the light interacting with the atoms alternates between the states of right and left circular polarization at a hyperfine frequency of the atoms.

68. The system of claim 66 wherein the light of alternating polarization is generated by intensity or frequency modulation of right circularly polarized (RCP) light combined with similarly modulated left circularly polarized (LCP) light that is shifted or delayed with respect to the right circularly polarized light by a half-integer multiple of a hyperfine period of the atoms.

69. The system of claim 66 wherein the light of alternating polarization is generated by combining two beams of mutually perpendicular linear polarizations, wherein optical frequencies of said beams differ by a hyperfine frequency of the atoms.

70. The system of claim 66 wherein the light of alternating polarization is generated by two counter-propagating beams, producing the electrical field vector or a component thereof that alternates at a hyperfine frequency of the atoms between rotating clockwise and rotating counter-clockwise in the plane perpendicular to the magnetic field direction at the location of the atoms.

71. The system of claim 66 wherein the light of alternating polarization is generated by a system of spectral lines, equally spaced in frequency by a hyperfine frequency of the atoms wherein each spectral line is linearly polarized, and polarizations of adjacent lines are mutually orthogonal.

72. The system of claim 66 wherein the light of alternating polarization is generated by means for generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms, and the atoms interacting with the light are mixed with a buffer gas producing an optical pressure broadening which is less than the ground-state hyperfine splitting frequency $v_{00}$.

73. The system of claim 66 wherein the light of alternating polarization is generated by means for generating pulses in intensity of right circular polarized light interspersed with pulses of left circularly polarized light and said pulses having a pulse width on the order of or less than one half of a hyperfine modulation period.

74. The system of claim 66 wherein the light of alternating polarization is formed of merged beams of a first beam of right circularly polarized light and a second beam left circularly polarized light, said first beam and said second beam are intensity modulated at a hyperfine frequency of the atoms such that intensity peaks of the left circularly polarized light follow intensity peaks of the right circularly polarized light by half a modulation period.

75. The system of claim 66 wherein the light of alternating polarization is formed of merged beams of a first beam of right circularly polarized light and a second beam left circularly polarized light, said first beam and said second beam are frequency modulated at half of a hyperfine frequency of the atoms such that a frequency maxima of the left circularly polarized light follow a frequency maxima of the right circularly polarized light by half a hyperfine period of the atoms.

76. The system of claim 66 wherein the light of alternating polarization is generated by:
   means for splitting a modulated or pulsed light beam into a first path and a second path;
   means for polarizing light in the first path into right circularly polarized light;
   means for polarizing light in the second path into left circularly polarized light;
   means for introducing a delay of a half-integer multiple of a hyperfine period between the right circularly polarized light in the first path and the left circularly polarized light in the second path; and
   means for recombining the first path and the second path.

77. The system of claim 66 wherein the light of alternating polarization is generated by or is composed of beams that are generated, by means for modulating the sources of said light with a waveform pattern or patterns that is shaped to optimize the performance of the magnetometer.

78. The system of claim 66 further comprising:
   means for detecting transmission of the light of alternating polarization through a medium including the atoms.

79. The system of claim 66 further comprising:
   means for detecting fluorescence of the atoms excited by the light of alternating polarization.

80. The system of claim 66 further comprising:
   means for analyzing the atomic state of the alkali-metal atoms in an atomic beam, irradiated with the light of alternating polarization.

81. The system of claim 66 wherein the atoms are rubidium atoms or cesium atoms.

* * * * *